United States Patent [19]

Rapshys

[11] 3,715,604

[45] Feb. 6, 1973

[54] INTEGRATED CIRCUIT FREQUENCY DIVIDER HAVING LOW POWER CONSUMPTION

[75] Inventor: William Rapshys, Palatine, Ill.

[73] Assignee: Motorola, Inc., Franklin Park, Ill.

[22] Filed: Aug. 9, 1971

[21] Appl. No.: 170,065

[52] U.S. Cl. ....................................307/220, 328/39

[51] Int. Cl. ............................................H03k 21/00

[58] Field of Search......307/220, 223, 225, 226, 290; 328/39, 42, 43

[56] References Cited

UNITED STATES PATENTS

| | | | |
|---|---|---|---|
| 3,619,643 | 11/1971 | Davis | 307/223 |
| 3,621,301 | 11/1971 | Tomczak | 307/290 |
| 3,304,439 | 2/1967 | Stratton | 307/225 R |
| 3,303,358 | 2/1967 | Krausz | 307/225 R |
| 3,246,175 | 4/1966 | Baldwin | 307/225 R |
| 2,846,594 | 8/1958 | Pankratz | 307/225 R |
| 3,350,579 | 10/1967 | Oman | 329/39 |

*Primary Examiner*—Herman Karl Saalbach
*Assistant Examiner*—R. E. Hart
*Attorney*—Mueller & Aichele

[57] ABSTRACT

Frequency divider including three stages each including three transistors, with two being connected in a common emitter circuit, and the third connected as an emitter-follower and providing intra-stage coupling. The three stages are connected in a ring-like configuration providing very high frequency, divide by three operation, and is adapted to be constructed in integrated circuit form. The circuit is suitable for use at low supply voltages.

5 Claims, 2 Drawing Figures

PATENTED FEB 6 1973 3,715,604

INTEGRATED CIRCUIT FREQUENCY DIVIDER HAVING LOW POWER CONSUMPTION

BACKGROUND OF THE INVENTION

This invention relates to frequency dividing circuits, and more particularly to a low power, high frequency, divide by three circuit which can be constructed in integrated circuit form.

Frequency dividers having three stages including transistors, which are connected in a ring-like configuration, are known. Such dividers are described in copending application Ser. No. 45,433, filed June 11, 1970, by William F. Davis, and assigned to the assignee of this application. However, prior frequency dividers of this type have not been suitable for many applications because they require relatively high voltage supplies and consume a relatively large amount of power. Also, prior circuits have required components such as zener diodes and capacitors which are not adapted for integrated circuit construction and which must be provided as separate discrete elements. Also, prior circuits have required constant current sources for the divider stages, and this has added to the circuit component and increased the resulting cost thereof, and has increased the complexity of the power supply required.

SUMMARY OF THE INVENTION

It is an object of this invention to provide an improved frequency divider which will operate at very high frequencies and which is adapted to be constructed in integrated circuit form.

Another object of the invention is to provide a divide by three circuit which includes three stages which may be identical, and each of which is formed entirely by transistors and resistors.

Still another object of the invention is to provide a divide by three circuit which can be constructed in integrated circuit form and which operates from a low supply voltage and consumes very low power.

In pracitcing the invention, a very high frequency divider circuit is provided which is formed entirely of transistors and resistors, and is well suited for construction as an integrated circuit. Three stages are provided, each including a pair of emitter coupled transistors which act in a differential manner, with an emitter-follower coupling the two transistors of each stage. The successive stages are coupled through a common collector resistor, so that the stages are triggered in turn to provide divide by three action. The stages are energized from a low voltage supply and consume very low power while providing high speed operation.

DETAILED DESCRIPTION

Figure 1:
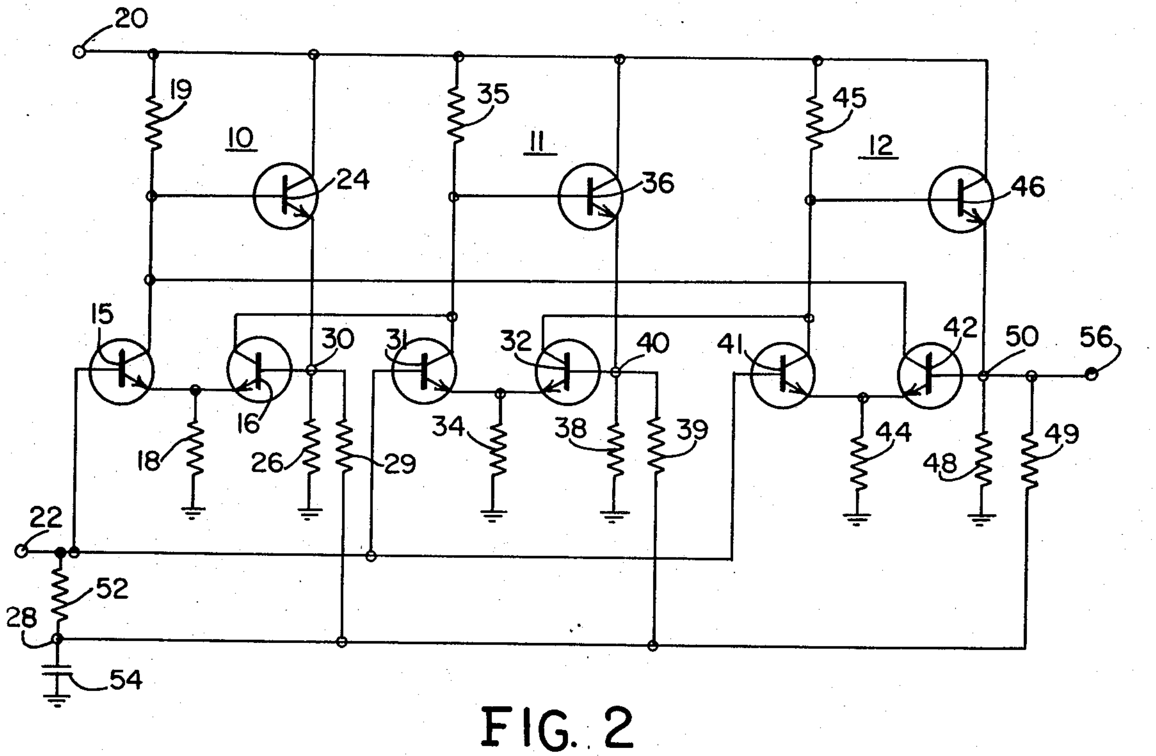
FIG. 1 is a circuit diagram of the divider circuit of the invention.

Referring now to FIG. 1, the frequency divider of the invention includes three stages 10, 11 and 12. The stage 10 is formed by a pair of transistors 15 and 16 having their emitters connected together and through resistor 18 to ground. The collector of the first transistor 15 is connected through resistor 19 to the supply voltage terminal 20, which provides a positive potential with respect to ground. The input signal from terminal 22 is applied to the base of transistor 15. The collector of transistor 15 is connected through emitter-follower transistor 24 to the base of the second transistor 16, with the bias potential for the base of transistor 16 being developed across resistor 26. The base of transistor 16 is connected to bias terminal 28 by resistor 29.

The stage 11 is identical to the stage 10 and includes a pair of transistors 31 and 32 having their emitters connected together and to ground through resistor 34. Input terminal 22 is also connected to the base of first transistor 31. The collector of transistor 31 is connected to the supply potential 20 by resistor 35. The emitter-follower transistor 36 connected from the collector of transistor 31 provides a bias potential across the resistor 38 for the base of the second transistor 32. The base of transistor 32 is also connected to the bias terminal 28 by resistor 39.

Stage 12 is also like stages 10 and 11 and includes a pair of transistors 41 and 42 having their emitters connected together and to ground through resistor 44. Input terminal 22 is also connected to the base of first transistor 41, and the collector of this transistor is connected through resistor 45 to the supply potential terminal 20. The emitter-follower transistor 46 is connected from the collector of transistor 41 and provides a bias voltage across resistor 48 which is applied to the base of second transistor 42. The base of transistor 42 is connected to bias terminal 28 by resistor 49.

The stages 10, 11 and 12 are coupled together by the connection of the collector of the second transistor 16 of the stage 10 to the collector of the first transistor 31 of the stage 11. Similarly, the collector of the second transistor 32 of the stage 11 is connected to the collector of the first transistor 41 of the stage 12, and the collector of the second transistor 42 of the stage 12 is connected back to the collector of the first transistor 15 of the stage 10. The three stages are therefore connected in a ring to provide divide by three action, as will be described.

Bias potential on bias terminal 28 is coupled through resistor 52 to the input terminal and to the base electrodes of transistors 15, 31 and 41. It may be desired to provide a capacitor 54 between terminal 28 and ground to stabilize the bias potential, but this potential tends to remain constant because the potential at the base electrodes of transistor 16, 32 and 42 have the same average value.

As previously stated, the input signal which is to be divided in frequency is applied to the base electrodes of the transistors 15, 31 and 41 of the stages 10, 11 and 12. The action of these stages depends on the voltage at the base of the other transistor of the pair, that is at the bases of transistors 16, 32 and 42 which act differentially with the transistors 15, 31 and 41, respectively. For convenience in describing the operation, the connections to the base electrodes of transistors 16, 32 and 42 are designated 30, 40 and 50, respectively. The output terminal 56 for the divider is connected to the point 50, but as will be apparent, the output can be derived from any one of the stages, as at the points 30 or 40, for example.

The voltages at the points 30, 40 and 50 will depend upon the conductivity of the various transistors in the stages. Considering the point 30, the voltage at this point is controlled by the emitter-follower 24, and will depend upon the drop in potential across resistor 19. It is to be noted that resistor 19 is in the collector circuit of transistors 15 and 42. If neither of these two transistors is conducting, the voltage applied by resistor 19 to the base of transistor 24 will be substantially the supply voltage, and the voltage at point 30 will be its maximum or high potential. If one of the transistors 15 and 42 conducts, current will flow through resistor 19 to decrease the voltage applied to the base of emitter-follower transistor 24, to thereby reduce the voltage at point 30. This provides an intermediate potential at point 30. If both of the transistors 15 and 42 conduct, the current through resistor 19 will be increased to further reduce the voltage at point 30 to a low potential. Accordingly, the point 30 during the various steps of operation of the divider will be at one of three different potentials, the high or maximum potential when neither transistor 15 or 42 conducts, an intermediate potential when either one of the transistors 15 or 42 conducts, and the low potential when both transistors 15 and 42 conduct.

Similarly, the voltage at points 40 and 50 will have three different levels. The voltage at point 40 depends upon the conduction of transistors 16 and 31, and the voltage at point 50 depends upon the conduction of transistors 32 and 41.

Figure 2:
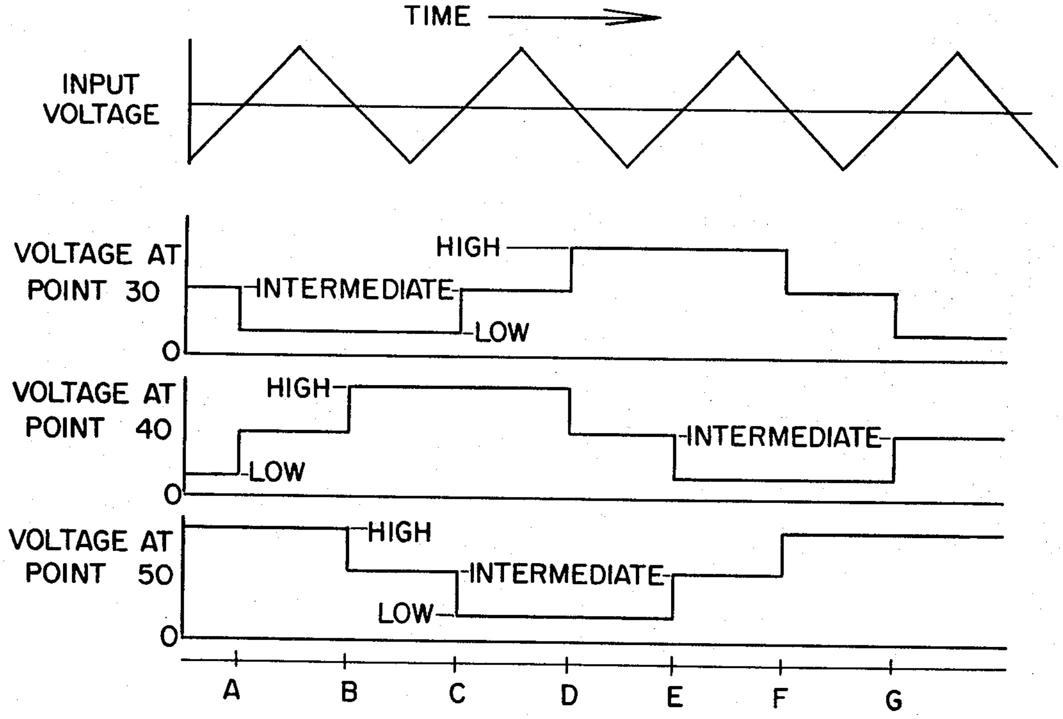
FIG. 2 is a timing diagram illustrating the operation of the circuit of FIG. 1.

FIG. 2 illustrates the operation of the circuit of FIG. 1. Although the input could be an alternating current signal or wave of any wave shape, such as a sine wave, in FIG. 2, the input voltage is illustrated as a triangular wave. The top line in FIG. 2 shows the input signal and the next three lines show the potentials at points 30, 40 and 50, respectively. We will assume that at the start of the sequence, in stage 10, transistor 15 is off and transistor 16 is conducting, in stage 11, transistor 31 is conducting and transistor 32 is off, and in stage 12, transistor 41 is off and transistor 42 is conducting. Then the voltage at point 30 is intermediate, the voltage at point 40 is low, and the voltage at point 50 is high.

As the input voltage rises, at time A the voltage on the base of transistor 15 will increase above the voltage on the base of transistor 16, which is at an intermediate level. This will cause transistor 15 to conduct and transistor 16 to cut off to actuate stage 10. The input voltage applied to bases of transistor 31 and 41 will not change the operation of these stages since transistor 31 is already on, and transistor 41, although off, will not be turned on because point 50 connected to the base of transistor 42 is at a high potential and the voltage applied to the base of transistor 41 is not sufficient to cause transistors 41 and 42 to change states. When transistor 15 turns on, the voltage drop across resistor 19 increases to drop the potential at terminal 30 from the intermediate to the low level. As the transistor 16 turns off, the voltage drop across resistor 35 is reduced so that the voltage at point 40 will be increased. Since no change is made in the conductivity of transistors 32 and 41, there will be no change in the potential at point 50.

As the input voltage wave drops to the axis at time B, this will cause transistor 31 to turn off, since the voltage at point 40 connected to the base of transistor 32 is now at the intermediate level, and the signal applied to the base of transistor 31 drops to a potential below this level. This will reduce the voltage drop across resistor 35 so that the voltage at point 40 rises from the intermediate to the high level. Transistor 32 will turn on when transistor 31 turns off, and this will cause current flow through resistor 45 to drop the voltage at point 50 from the high to the intermediate level.

As the input voltage wave again increases through the axis at time C, the voltage at the base of transistor 41 will exceed the intermediate level at point 50 connected to the base of transistor 42, so that transistor 41 turns on and transistors 42 turns off. Conduction of transistor 41 will cause the current through resistor 45 to increase to further drop the potential at point 50 from the intermediate to the low level. The turn off of transistor 42 will reduce the voltage drop through resistor 19, so that the potential at point 30 will rise from the low to the intermediate level.

The action as described will continue through the time points marked D, E and F. At time D, the potential at point 30 rises to the high level, the potential at point 40 drops to the intermediate level, and the potential at point 50 remains at the low level. At time E, the potential at point 30 remains at the high level, the potential at point 40 drops to the low level, and the potential at point 50 rises to the intermediate level. At time F, the potential at point 30 drops from the high level to the intermediate level, the potential at point 40 remains in the low level and the potential at point 50 rises from the intermediate level to the high level. It will be noted that this returns the potentials at the point 30, 40 and 50 to the same levels as when the operation started. At time G, the stages are all in the same state as at time A.

The three cycles of the input voltage which have been described results in one cycle of the potentials at points 30, 40 and 50. It will be noted that at all times, one point 30, 40 or 50 is at the intermediate level, one is at the high level, and one is at the low level. This acts to hold the potential at bias terminal 52 substantially constant. It is only the stage having a reference potential at the intermediate level which can change states as the input voltage crosses the axis. This is because in the stage having a low reference potential, the first transistor of the stage is conducting and it is not affected by the input voltage. In the stage having a high reference potential, the input signal is not large enough to turn on the first transistor. Since three cycles of the input voltage are required to provide one cycle in each of the stages, a divide by three action results. As previously pointed out, the output can be derived from any one of the stages.

Although the divider circuit has been illustrated and described as having three stages for divide by three action, it will be obvious that a larger number of stages, such as five, might be used. In such case the stages will be connected in a ring configuration, as has been illustrated.

It will be apparent that the circuit of FIG. 1 can be constructed in integrated circuit form, since it is composed entirely of transistors and resistors. It includes no inductors or capacitors, except capacitor 54 and as previously stated, the capacitor 54 is not an essential element. If if is desired to use such a capacitor with this circuit, this can be provided as a separate discrete element.

The frequency divider of the invention has been constructed in integrated circuit form and has been found to be usable at frequencies in excess of 600 megahertz. The circuit has been found to operate satisfactorily from a supply voltage of 3 volts. A separate bias voltage is not required, and it is not necessary to have both positive and negative power supply potentials. Although the frequency divider is suitable for general application, it has been proposed in particular for use in a phase lock loop transmitter.

I Claim:

1. A frequency divider circuit including in combination, at least three stages each having a pair of transistors with base, emitter and collector electrodes, means connecting the emitter electrodes of the transistors of each pair to a reference potential to provide differential action therebetween, each of said stages including a third transistor connected as an emitter-follower between the collector electrode of the first transistor of a pair and the base electrode of the second transistor of the pair, impedance means connecting said collector electrode of each of said first transistors of said pairs to potential supply means, input means connected to said base electrodes of said first transistors of all said pairs of transistors for applying thereto a voltage wave whose frequency is to be divided;

means providing a direct coupling between said collector electrode of the second transistor of each pair and the collector electrode of the first transistor of another pair in a ring-like manner; and bias circuit means including a resistor connected between said base electrode of each of said second transistors and a reference potential and including a portion connected to said base electrodes of said first transistors for applying a bias potential thereto.

2. A frequency divider circuit in accordance with claim 1 wherein said third transistor of each stage includes base, emitter and collector electrodes, with said base electrode being connected to said collector electrode of the first transistor of the stage, said collector electrode being connected to the potential supply means, and said emitter electrode being connected to said base electrode of said second transistor of the associated stage for controlling the bias potential applied thereto.

3. A frequency divider circuit in accordance with claim 1 wherein said means connecting said emitter electrodes of said transistors of each pair to a reference potential is a resistor, and wherein each of said impedance means is a resistor.

4. A frequency divider circuit in accordance with claim 3 wherein said portion of said bias circuit means includes individual resistors connected between said base electrodes of said second transistors and a common point, and a further resistor connected between said common point and said base electrodes of said first transistors.

5. A frequency divider circuit in accordance with claim 4 wherein said transistors, said resistors and the interconnections therebetween are provided as an integrated circuit on a semiconductor chip.

* * * * *